United States Patent
Mizoguchi

(10) Patent No.: US 9,419,579 B2
(45) Date of Patent: Aug. 16, 2016

(54) BAND PASS FILTER CIRCUIT AND MULTILAYER BAND PASS FILTER

(71) Applicant: Murata Manufacturing Co., Ltd., Nagaokakyo-shi, Kyoto-fu (JP)

(72) Inventor: Naoki Mizoguchi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/501,251

(22) Filed: Sep. 30, 2014

(65) Prior Publication Data

US 2015/0155844 A1 Jun. 4, 2015

(30) Foreign Application Priority Data

Dec. 3, 2013 (JP) ................ 2013-249972

(51) Int. Cl.
*H03H 7/09* (2006.01)
*H03H 7/01* (2006.01)
*H03H 1/00* (2006.01)

(52) U.S. Cl.
CPC ............ *H03H 7/0115* (2013.01); *H03H 7/09* (2013.01); *H03H 2001/0085* (2013.01)

(58) Field of Classification Search
CPC ............... H03H 2001/0085; H03H 7/0115
USPC .................................. 333/175, 185
See application file for complete search history.

(56) References Cited

U.S. PATENT DOCUMENTS

| | | | | |
|---|---|---|---|---|
| 4,533,885 A | * | 8/1985 | Higgins, Jr. ........... | H03H 9/56 310/366 |
| 2002/0030561 A1 | * | 3/2002 | Masuda ................. | H03H 3/00 333/177 |
| 2009/0219029 A1 | | 9/2009 | Barsukov et al. | |
| 2010/0026420 A1 | * | 2/2010 | Chin ..................... | H03H 7/0115 333/185 |
| 2010/0039189 A1 | | 2/2010 | Taniguchi | |

FOREIGN PATENT DOCUMENTS

| | | |
|---|---|---|
| JP | 59-5714 A | 1/1984 |
| JP | 4-284606 A | 10/1992 |
| JP | 05-048365 A | 2/1993 |
| JP | 2001-185972 A | 7/2001 |
| JP | 2001-345213 A | 12/2001 |
| JP | 2009-515163 A | 4/2009 |
| WO | 2008/143071 A1 | 11/2008 |

OTHER PUBLICATIONS

Official Communication issued in corresponding Japanese Patent Application No. 2013-249972, mailed on Sep. 29, 2015.

* cited by examiner

*Primary Examiner* — Robert Pascal
*Assistant Examiner* — Rakesh Patel
(74) *Attorney, Agent, or Firm* — Keating & Bennett, LLP

(57) ABSTRACT

A band pass filter circuit includes an input terminal, an output terminal, a signal line, and a plurality of main LC parallel resonators. First ends of the plurality of main LC parallel resonators are connected to the signal line, and second ends of the plurality of main LC parallel resonators are connected to one another. At least one attenuation-pole-defining sub LC parallel resonator including an inductor and a capacitor is inserted between a ground and the connected second ends of the plurality of main LC parallel resonators.

11 Claims, 7 Drawing Sheets

········· FIRST EMBODIMENT
——— SECOND EMBODIMENT

........... FIRST EMBODIMENT
———— THIRD EMBODIMENT

BAND PASS FILTER CIRCUIT AND MULTILAYER BAND PASS FILTER

BACKGROUND OF THE INVENTION

1. Field of the Invention

The present invention relates to a band pass filter circuit and a multilayer band pass filter preferably for use in high-frequency apparatuses.

2. Description of the Related Art

In mobile apparatuses, such as a notebook personal computer, a smart phone, a tablet terminal, and a cellular phone, a band pass filter is used as an electronic component that allows only signals in a predetermined frequency band to pass therethrough.

Examples of known fundamental configurations of band pass filters include an LC resonant circuit band pass filter in which an LC parallel resonant circuit is connected to a signal line that connects an input terminal and an output terminal to each other, as disclosed in International Publication No. WO2008/143071.

FIG. 12 illustrates the equivalent circuit of a multilayer band pass filter in which the existing LC-resonant-circuit-type band pass filter disclosed in International Publication No. WO2008/143071 is formed of two stages of LC parallel resonant circuits.

FIG. 13 illustrates the attenuation characteristics of the existing multilayer band pass filter illustrated in FIG. 12, obtained by simulation.

As can be seen from FIG. 13, in the attenuation characteristics of this multilayer band pass filter, the attenuation curve gradually falls on the high-frequency side outside of the passband. Hence, when there is another nearby high-frequency device whose passband is close to the above passband, mutual interference between the two will be generated in a frequency band with low attenuation, causing degradation in reception sensitivity.

To suppress the interference of high-frequency devices, a band pass filter with high attenuation outside of a passband is required. However, the band pass filter formed of the above-described circuit configuration is not able to meet market requirements in some cases.

SUMMARY OF THE INVENTION

Accordingly, preferred embodiments of the present invention provide a band pass filter that has high attenuation outside of a passband to avoid degradation in reception sensitivity due to mutual interference between high-frequency devices.

According to a preferred embodiment of the present invention, a band pass filter circuit includes an input terminal, an output terminal, a signal line connecting the input terminal and the output terminal to each other, and a plurality of main LC parallel resonators each including an inductor and a capacitor. The plurality of main LC parallel resonators are configured to be electromagnetically coupled with one another in a predetermined manner. First ends of the plurality of main LC parallel resonators are connected to the signal line, and second ends of the plurality of main LC parallel resonators are connected to one another. At least one sub LC parallel resonator, including an inductor and a capacitor, which defines an attenuation pole is inserted between a ground and the connected second ends of the plurality of main LC parallel resonators.

Note that the sub LC parallel resonator may have a higher resonant frequency than the plurality of main LC parallel resonators. In this case, the attenuation on the high-frequency side outside of the bassband is expected to be improved.

According to a preferred embodiment of the present invention, the band pass filter circuit may be configured as a multilayer band pass filter including a plurality of dielectric layers, a plurality of capacitor-defining conductor patterns, a plurality of inductor-defining conductor patterns, at least one grounding conductor pattern, and a plurality of via conductors.

With band pass filter circuits according to various preferred embodiments of the present invention, by inserting a sub LC parallel resonator that defines an attenuation pole, an attenuation pole is outside of the passband of a band pass filter, such that the attenuation characteristics outside of the passband of the band pass filter are improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the attached drawings.

First Preferred Embodiment

Figure 1:
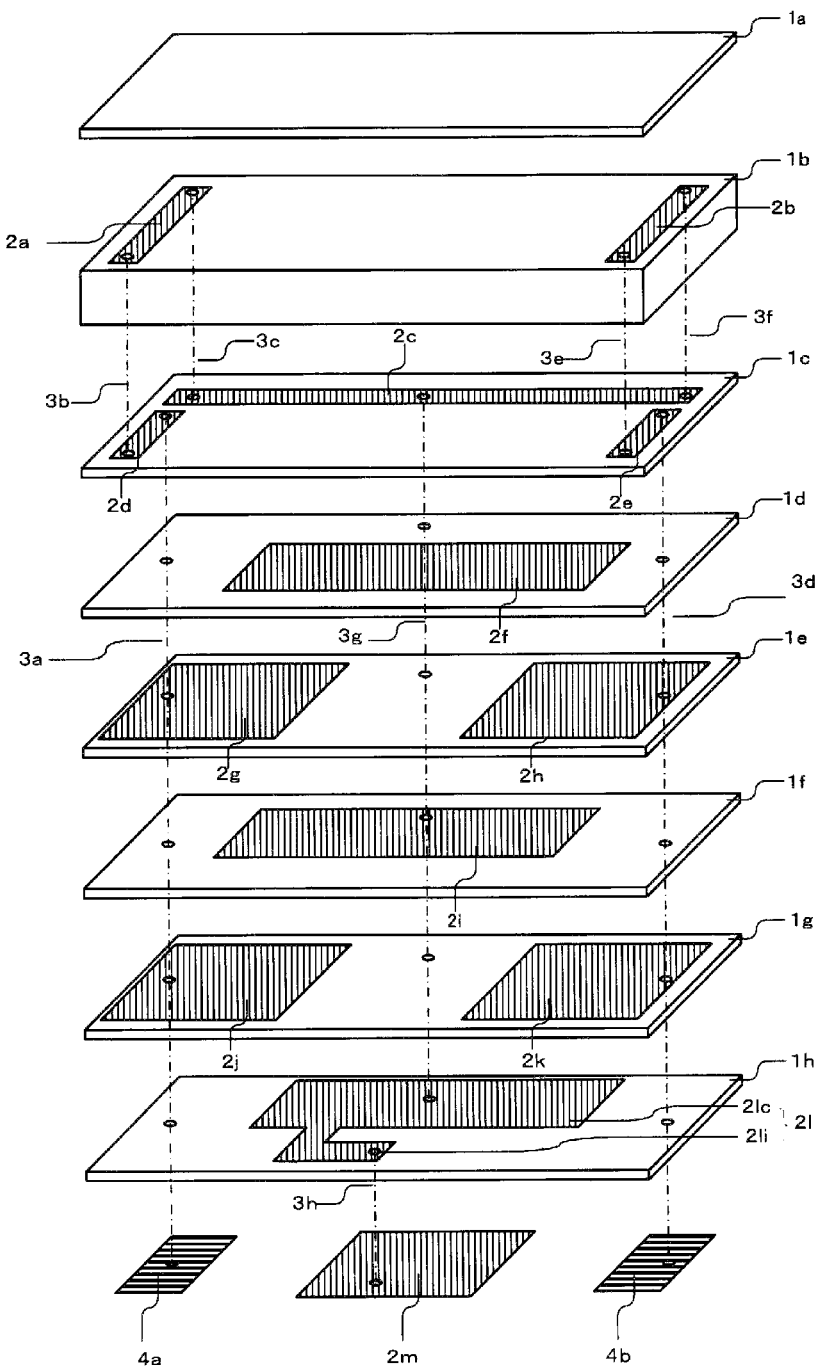
FIG. 1 is an exploded perspective view of a multilayer band pass filter according to a first preferred embodiment of the present invention.
Figure 2:
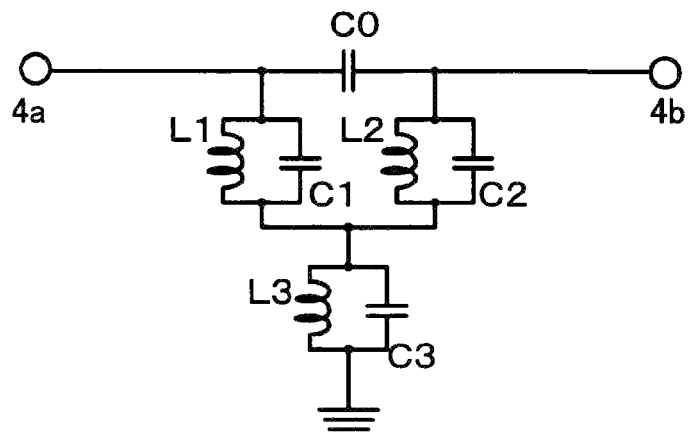
FIG. 2 illustrates an equivalent circuit of the multilayer band pass filter according to the first preferred embodiment of the present invention.

FIG. 1 and FIG. 2 respectively illustrate a band pass filter circuit according to a first preferred embodiment of the present invention and a multilayer band pass filter in which the band pass filter circuit is provided. Note that FIG. 1 is an exploded perspective view and FIG. 2 illustrates an equivalent circuit. As illustrated in FIG. 1, a multilayer band pass filter of the present preferred embodiment includes dielectric layers $1a$ to $1h$ that are sequentially stacked on top of one another with the dielectric layer $1h$ at the bottom and the dielectric layer $1a$ at the top. Materials that can be used for the dielectric layers $1a$ to $1h$ include materials that have been used in existing multilayer band pass filters, such as a low-temperature co-fired ceramic substrate (LTCC substrate), an alumina substrate, and a resin substrate, for example.

Conductor patterns $2a$ to $2m$ having predetermined pattern shapes are provided on the main surfaces of the stacked dielectric layers $1a$ to $1h$, as required. Note that conductor patterns need not always be formed as interlayer conductor patterns between the dielectric layers, and there may be some dielectric layers that do not have interlayer conductor patterns therebetween. Materials that can be used for the conductor patterns $2a$ to $2m$ include Ag, Cu, Au, Ag—Pd, and the like that have been used in existing multilayer band pass filters, for example.

Conductor vias $3a$-$3h$ are arranged in the dielectric layers $1a$ to $1h$ so as to extend through both of the main surfaces thereof at predetermined positions, as required. Materials that can be used for the conductor vias $3a$-$3h$ include Ag, Cu, Au, Ag—Pd, and the like that have been used in existing multilayer band pass filters, for example. Note that when there is a case in which conductor vias provided in different dielectric layers are denoted by the same reference symbol, this indicates that these vias are connected to one another. For example, the conductor vias $3g$ are provided in the dielectric layers $1c$ to $1g$ such that these vias $3g$ are connected to one another.

An input terminal electrode $4a$, an output terminal electrode $4b$, and a ground terminal electrode conductor pattern $2m$ are provided on the lower main surface of the dielectric layer $1h$, which is stacked at the lowermost position. Materials that can be used for the input terminal electrode $4a$ and the output terminal electrode $4b$ include Ag, Cu, Au, Ag—Pd, and the like that have been used in existing multilayer band pass filters, for example.

In the multilayer band pass filter according to the first preferred embodiment, the input terminal electrode $4a$, the output terminal electrode $4b$, and the conductor patterns $2a$ to $2m$ are connected by the conductor vias $3a$-$3h$, thus defining a band pass filter circuit whose equivalent circuit is illustrated in FIG. 2.

Hereinafter, the dielectric layers $1a$ to $1h$ and the input terminal electrode $4a$, the output terminal electrode $4b$, the conductor patterns $2a$ to $2m$, and the conductor vias $3a$-$3h$ provided on or in the dielectric layers $1a$ to $1h$ will be described in more detail. Note that for convenience of explanation, the dielectric layer $1h$ stacked at the lowermost position will be first described, then the dielectric layers stacked on top of one another will be described in sequence, and finally the dielectric layer $1a$ stacked at the uppermost position will be described.

As described above, on the lower main surface of the dielectric layer $1h$ stacked at the lowermost position, the input terminal electrode $4a$, the output terminal electrode $4b$, and the ground terminal electrode conductor pattern $2m$ are provided. The conductor via $3a$, the conductor via $3d$, and the conductor via $3h$ are extend through the two main surfaces of the dielectric layer $1h$. The conductor via $3a$, the conductor via $3d$, and the conductor via $3h$ are respectively connected to the input terminal electrode $4a$, the output terminal electrode $4b$, and the ground terminal electrode conductor pattern $2m$.

A conductor pattern $2l$ is provided on the upper main surface of the dielectric layer $1h$. The conductor pattern $2l$ preferably includes a rectangular or substantially rectangular capacitor-defining conductor pattern $2lc$ and an inductor-defining conductor pattern $2li$, extending from the conductor pattern $2lc$. The conductor vias $3a$, $3d$, and $3h$ extend through the two main surfaces of the dielectric layer $1h$. The conductor via $3h$ provided in the dielectric layer $1h$ is connected to the inductor-defining conductor pattern $2li$ of the conductor pattern $2l$. The conductor via $3a$ provided in the dielectric layer $1h$ is connected to the conductor via $3a$ that is denoted by the same reference symbol and provided in the dielectric layer $1g$. The conductor via $3d$ provided in the dielectric layer $1h$ is connected to the conductor via $3d$ that is denoted by the same reference symbol and provided in the dielectric layer $1g$. The conductor via $3g$ provided in the dielectric layer $1h$ is connected to the conductor via $3g$ that is denoted by the same reference symbol and provided in the dielectric layer $1g$. As described above, the conductor vias that are denoted by the same reference symbol and provided in the dielectric layers neighboring each other are connected to each other. Hereinafter, the description thereof may be omitted in some cases for the sake of brevity.

The dielectric layer $1g$ is stacked on top of the dielectric layer $1h$. On the upper main surface of the dielectric layer $1h$, the rectangular or substantially rectangular capacitor-defining conductor patterns $2j$ and $2k$ are provided. The conductor vias $3a$, $3d$, and $3g$ extend through the two main surfaces of the dielectric layer $1g$. The conductor via $3a$ is connected to the capacitor-defining conductor pattern $2j$. The conductor via $3d$ is connected to the capacitor-defining conductor pattern $2k$. The conductor via $3d$ is connected to the capacitor-defining conductor pattern $2k$. The conductor via $3g$ is connected to the capacitor-defining conductor pattern $2lc$ of the conductor pattern $2l$, provided on the upper main surface of the dielectric layer $1h$.

The dielectric layer $1f$ is stacked on top the dielectric layer $1g$. On the upper main surface of the dielectric layer $1f$, the rectangular or substantially rectangular capacitor-defining conductor pattern $2i$ is formed. The conductor vias $3a$, $3d$, and $3g$ extend through the two main surfaces of the dielectric layer $1f$. The conductor via $3g$ is connected to the capacitor-defining conductor pattern $2i$.

The dielectric layer $1e$ is stacked on top the dielectric layer $1f$. On the upper main surface of the dielectric layer $1e$, the rectangular or substantially rectangular capacitor-defining conductor patterns $2g$ and $2h$ are provided. The conductor vias $3a$, $3d$, and $3g$ extend through the two main surfaces of the dielectric layer $1e$. The conductor via $3a$ is connected to the capacitor-defining conductor pattern $2g$. The conductor via $3d$ is connected to the capacitor-defining conductor pattern $2h$.

The dielectric layer $1d$ is stacked on top the dielectric layer $1e$. On the upper main surface of the dielectric layer $1d$, the rectangular or substantially rectangular capacitor-defining conductor pattern $2f$ is provided. The conductor vias $3a$, $3d$, and $3g$ extend through the two main surfaces of the dielectric layer $1d$. The capacitor-defining conductor pattern $2f$ is not connected to any of the conductor vias.

The dielectric layer $1c$ is stacked on top the dielectric layer $1d$. The inductor-defining conductor pattern $2c$ is provided on the upper main surface of the dielectric layer $1c$, along one of the long sides thereof, and the inductor-defining conductor patterns 2d and 2e are provided on the upper main surface of the dielectric layer 1c respectively along the two short sides thereof. The conductor vias 3a, 3d, and 3g extend through the two main surfaces of the dielectric layer 1d. The conductor via 3a is connected to one end of the inductor-defining conductor pattern 2d. The conductor via 3d is connected to one end of the inductor-defining conductor pattern 2e. The conductor via 3g is connected to the center portion of the inductor-defining conductor pattern 2c.

The dielectric layer 1b is stacked on top the dielectric layer 1c. The thickness of the dielectric layer 1b is larger than those of the other dielectric layers 1a and 1c to 1h. The dielectric layer 1b may be a single thick dielectric layer, or may be formed by stacking a plurality of dielectric layers having the same thickness as the dielectric layers 1a and 1c to 1h on top of one another, for example. The inductor-defining conductor patterns 2a and 2b are provided on the upper main surface of the dielectric layer 1b, along the respective two short sides thereof. The conductor vias 3b, 3c, 3e, and 3f extend through the two main surfaces of the dielectric layer 1b. The conductor via 3b is connected to one end of the inductor-defining conductor pattern 2a and to the other end of the inductor-defining conductor pattern 2d formed on the dielectric layer 1c. The conductor via 3c is connected to the other end of the conductor pattern 2a and to one end of the inductor-defining conductor pattern 2c provided on the dielectric layer 1c. The conductor via 3e is connected to one end of the inductor-defining conductor pattern 2b and to the other end of the inductor-defining conductor pattern 2e provided on the dielectric layer 1c. The conductor via 3f is connected to the other end of the inductor-defining conductor pattern 2b and to the other end of the inductor-defining conductor pattern 2c provided on the dielectric layer 1c.

The dielectric layer 1a is stacked on top of the dielectric layer 1b. The dielectric layer 1a is a protection layer and does not include a conductor pattern provided thereon or a conductor via provided therein.

The band pass filter configured as described above according to the first preferred embodiment has an equivalent circuit illustrated in FIG. 2.

In the multilayer band pass filter according to the first preferred embodiment, a coupling capacitor C0 is inserted between the input terminal electrode 4a and the output terminal electrode 4b, such that a signal line is provided.

The coupling capacitor C0 is preferably configured such that a capacitor including the capacitor-defining conductor pattern 2g and the capacitor-defining conductor pattern 2f and a capacitor including the capacitor-defining conductor pattern 2f and the capacitor-defining conductor pattern 2h are connected in series with each other.

As a result, the signal line includes a path that connects the input terminal electrode 4a, the conductor via 3a, the capacitor-defining conductor pattern 2g, the capacitor-defining conductor pattern 2f, the capacitor-defining conductor pattern 2h, the conductor via 3d, and the output terminal electrode 4b to one another in this order.

The multilayer band pass filter according to the first preferred embodiment includes a first-stage main LC parallel resonator including a capacitor C1 and an inductor L1 connected in parallel with each other and a second-stage main LC parallel resonator including a capacitor C2 and an inductor L2 connected in parallel with each other. One end of the first-stage main LC parallel resonator is connected to the signal line, which is between the input terminal electrode 4a and the coupling capacitor C0. One end of the second-stage main LC parallel resonator is connected to the signal line, which is between the coupling capacitor C0 and the output terminal electrode 4b. One end of the second-stage main LC parallel resonator is connected to the signal line, which is between the coupling capacitor C0 and the output terminal electrode 4b.

The capacitor C1 of the first-stage main LC parallel resonator is preferably configured to include a capacitor including the capacitor-defining conductor pattern 2j and the capacitor-defining conductor pattern 2i and a capacitor including the capacitor-defining conductor pattern 2g and the capacitor-defining conductor pattern 2i connected in parallel with each other.

The inductor L1 of the first-stage main LC parallel resonator is preferably configured to include the inductor-defining conductor pattern 2d, the conductor via 3b, the inductor-defining conductor pattern 2a, the conductor via 3c, and a half (left half in FIG. 1) of the inductor-defining conductor pattern 2c, connected in series with one another in this order.

The capacitor C2 of the second-stage main LC parallel resonator is preferably configured to include a capacitor including the capacitor-defining conductor pattern 2k and the capacitor-defining conductor pattern 2i and a capacitor including the capacitor-defining conductor pattern 2h and the capacitor-defining conductor pattern 2i connected in parallel with each other.

The inductor L2 of the second-stage main LC parallel resonator is preferably configured to include the inductor-defining conductor pattern 2e, the conductor via 3e, the inductor-defining conductor pattern 2b, the conductor via 3f, and a half (right half in FIG. 1) of the inductor-defining conductor pattern 2c connected in series with one another in this order.

The other end of the first-stage main LC parallel resonator and the other end of the second-stage main LC parallel resonator are connected to each other at the conductor via 3g and connected to the capacitor-defining conductor pattern 2lc of the conductor pattern 2l provided on the dielectric layer 1h.

The multilayer band pass filter according to the first preferred embodiment includes an attenuation-pole-defining sub LC parallel resonator including a capacitor C3 and an inductor L3 connected in parallel with each other.

The capacitor C3 of the sub LC parallel resonator includes a capacitor including the capacitor-defining conductor pattern 2lc and the grounding conductor pattern 2m with the dielectric layer 1h therebetween. In other words, in the capacitor C3 of the sub parallel resonator, the grounding conductor pattern 2m is used as one of the capacitor electrodes.

The inductor L3 of the sub LC parallel resonator includes the inductor-defining conductor pattern 2li and the conductor via 3h connected to each other.

One end of the attenuation-pole-defining sub LC parallel resonator is connected to the conductor via 3g, and the other end is connected to the grounding conductor pattern 2m through the conductor via 3h, such that the attenuation-pole-defining sub LC parallel resonator is grounded.

The multilayer band pass filter according to the first preferred embodiment having the configuration and equivalent circuit described above preferably is manufactured using the following manufacturing method. Note that although an exemplary case in which a single multilayer band pass filter is manufactured is described below, in many of the actual manufacturing processes, a plurality of multilayer band pass filters are manufactured at the same time by preparing a large mother green sheet allowing production of multiple filters. In this case, a plurality of band pass filters formed as a single unit are divided into individual multilayer band pass filters in a certain stage of the manufacturing process.

First, a plurality of dielectric green sheets are prepared. The dielectric green sheets are used to form the respective dielectric layers 1a to 1h.

Then, holes for defining the conductor vias 3a-3h are formed in the dielectric green sheets for the dielectric layers 1b to 1h. The holes are formed by irradiating the dielectric green sheets layers with laser light, for example.

Then, the conductor patterns 2a to 2m, the input terminal electrode 4a, the output terminal electrode 4b, and the conductor vias 3a-3h are formed on or in the dielectric green sheets for the dielectric layers 1b to 1h. Specifically, conductive paste is printed in predetermined shapes on the appropriate main surfaces of the dielectric green sheets for the dielectric layers 1b to 1h. As a result, the holes for defining the conductor vias 3a-3h, provided in the dielectric green sheets for the dielectric layers 1b to 1h, are filled with the conductive paste, such that the conductor vias 3a-3h are formed. The conductor patterns 2a to 2m, the input terminal electrode 4a, and the output terminal electrode 4b are formed on the appropriate main surfaces of the dielectric green sheets for the dielectric layers 1b to 1h.

Next, the dielectric green sheet for the dielectric layer 1a is stacked on top of the dielectric green sheets for the dielectric layers 1b to 1h, and they are press-bonded, such that the multilayer body is formed.

Finally, the multilayer body is sintered with a predetermined profile, such that the multilayer band pass filter according to the first preferred embodiment is completed.

Figure 3:
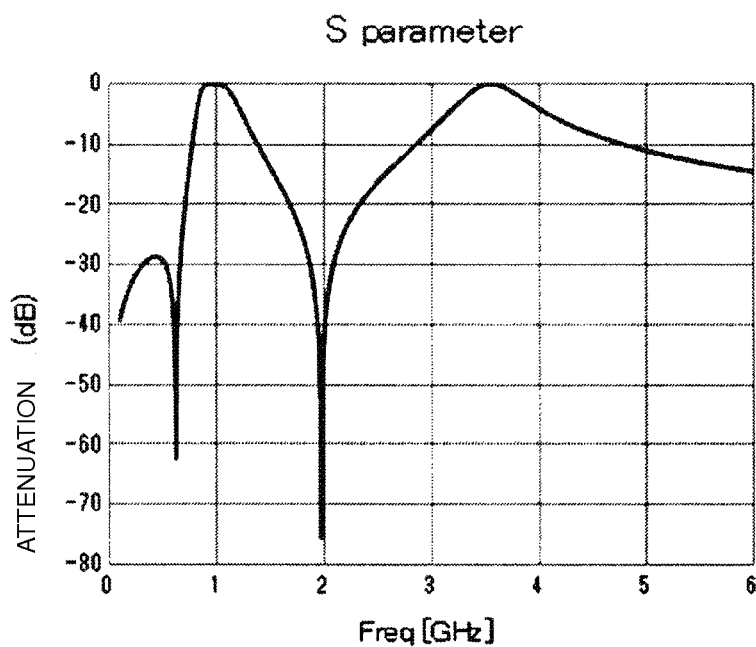
FIG. 3 is a graph illustrating the attenuation characteristics of the multilayer band pass filter according to the first preferred embodiment of the present invention.
Figure 13:
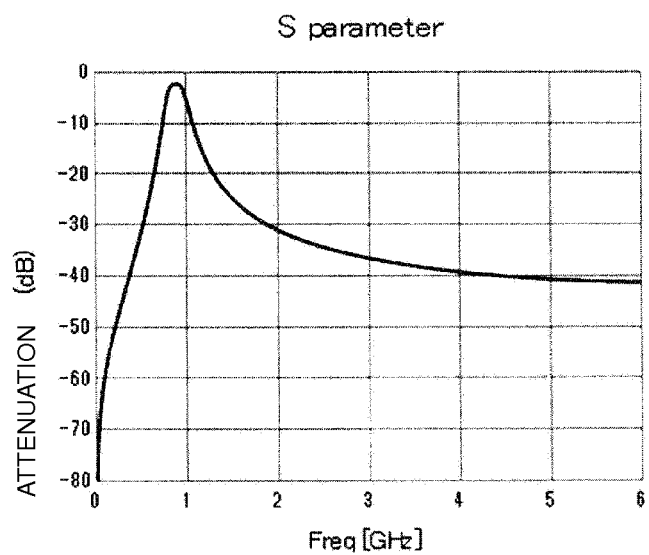
FIG. 13 is a graph illustrating the attenuation characteristics of the existing multilayer band pass filter illustrated in FIG. 12.

FIG. 3 illustrates the attenuation characteristics of the multilayer band pass filter according to the first preferred embodiment. In the band pass filter of the present preferred embodiment, since the other end of the first-stage main LC parallel resonator and the other end of the second-stage main LC parallel resonator are connected to each other and the attenuation-pole-defining sub LC parallel resonator is inserted between the connected ends and the ground, the attenuation on the high-frequency side outside of the pass band is high. In the multilayer band pass filter of the present preferred embodiment, the possibility of crosstalk on the high-frequency side is low, compared with the existing band pass filter illustrated in FIG. 13.

The band pass filter circuit and the band pass filter including this circuit according to the first preferred embodiment of the present invention has been described. However, the content of the present invention is not limited to the content described above, and various modifications can be made within the spirit of the present invention.

For example, in the multilayer band pass filter according to the first preferred embodiment, although the capacitor C3 of the sub LC parallel resonator preferably includes the neighboring two capacitor-defining conductor pattern 2lc and the grounding conductor pattern 2m facing each other with the dielectric layer 1h therebetween, the number of the dielectric layer(s) is not limited to this and may be increased to two or more, for example.

Further, although the two-stage band pass filter including two main LC parallel resonators is preferably used in the band pass filter circuit and the multilayer band pass filter according to the first preferred embodiment, a band pass filter having three stages or more may be used by providing three or more of the main LC parallel resonators, for example.

Further, by adding one or more of the sub LC parallel resonators, these sub LC parallel resonators may be connected in parallel with one another.

Second Preferred Embodiment

A multilayer band pass filter according to a second preferred embodiment has a configuration in which the shape of the conductor pattern 2l provided on the dielectric layer 1h of the multilayer band pass filter according to the first preferred embodiment illustrated in FIG. 1 has been changed. The rest of the configuration of the multilayer band pass filter according to the second preferred embodiment preferably is the same as that of the multilayer band pass filter according to the first preferred embodiment.

Figure 4:
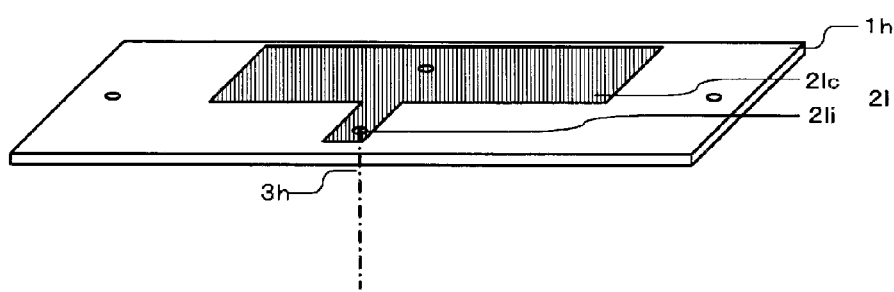
FIG. 4 is a perspective view of a dielectric layer and a conductor pattern included in the multilayer band pass filter according to a second preferred embodiment of the present invention.

FIG. 4 illustrates a dielectric layer 1h and a conductor pattern 2l provided on the upper main surface of the dielectric layer 1h. For descriptive purposes, the dielectric layer under discussion is denoted by 1h and a conductor pattern formed on the upper main surface thereof is denoted by 2l, both in the multilayer band pass filters of the first and second preferred embodiments. This is also true in a third and subsequent preferred embodiments.

In the multilayer band pass filter according to the second preferred embodiment, an inductor-defining conductor pattern 2li of the conductor pattern 2l preferably is shorter than that of the first preferred embodiment, and the inductance of the inductor L3 of the attenuation-pole-defining sub LC parallel resonator has been reduced. The shape of a capacitor-defining conductor pattern 2lc has not been changed and, hence, the capacitance of the capacitor C3 of the sub LC parallel resonator remains the same.

Figure 5:
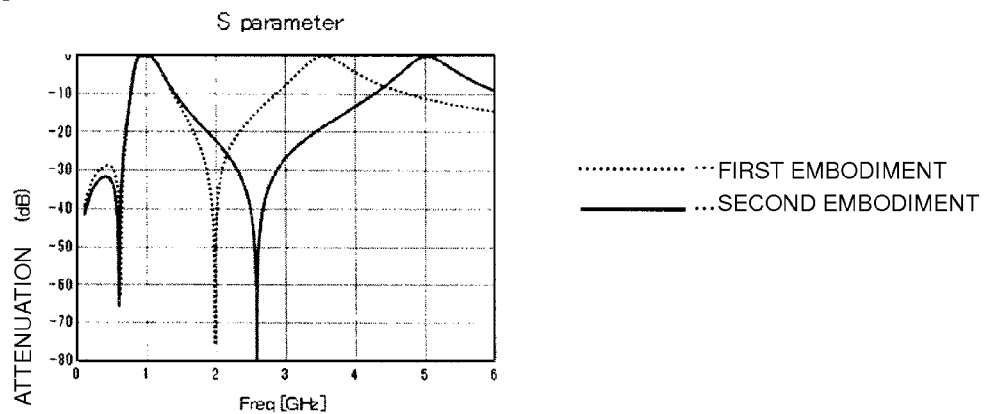
FIG. 5 is a graph illustrating the attenuation characteristics of the multilayer band pass filter according to the second preferred embodiment of the present invention.

FIG. 5 illustrates the attenuation characteristics of the multilayer band pass filter according to the second preferred embodiment. In the attenuation characteristics of the multilayer band pass filter according to the second preferred embodiment, the attenuation pole has shifted toward a higher frequency, compared with the attenuation characteristics of the multilayer band pass filter according to the first preferred embodiment illustrated in FIG. 3.

In the second preferred embodiment, with the first preferred embodiment as a reference, the inductance of the inductor L3 of the sub LC parallel resonator has been changed while the capacitance of the capacitor C3 has been kept fixed. The length of the inductor-defining conductor pattern 2li from the conductor pattern 2lc to the conductor via 3h has been changed in the shape of a straight or substantially straight line, in order to change the inductance of the inductor L3. However, any shape may be used to obtain a desired inductance. Examples of the shape that can be used include, a curved or substantially curved line, a rectangular or substantially rectangular shape, a meandering or substantially meandering shape, and a saw-like or saw-like shape. It is also possible to change the capacitance of the inductor L3 by changing the thickness of the dielectric layer 1h.

In this manner, the frequency of an attenuation pole is changed by changing the inductance of the inductor L3 of the sub LC parallel resonator.

Third Preferred Embodiment

A multilayer band pass filter according to a third preferred embodiment also has a configuration in which the shape of the conductor pattern 2l provided on the dielectric layer 1h of the multilayer band pass filter according to the first preferred embodiment illustrated in FIG. 1 has been changed. The rest of the configuration of the multilayer band pass filter according to the third preferred embodiment is preferably the same as that of the multilayer band pass filter according to the first preferred embodiment.

Figure 6:
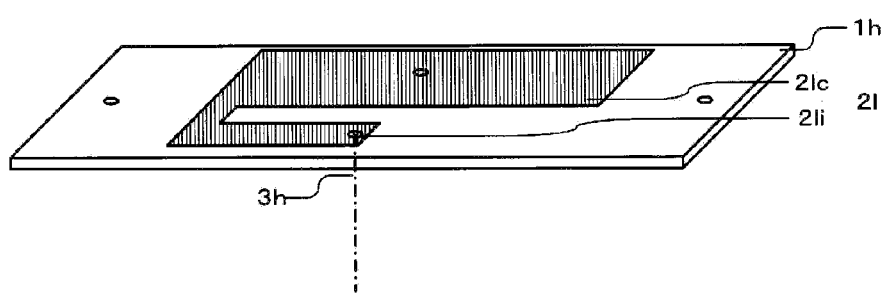
FIG. 6 is a perspective view of a dielectric layer and a conductor pattern used in a multilayer band pass filter according to a third preferred embodiment of the present invention.

FIG. 6 illustrates a dielectric layer 1h and a conductor pattern 2l provided on the upper main surface of the dielectric layer 1h of the multilayer band pass filter according to the third preferred embodiment.

In the multilayer band pass filter according to the third preferred embodiment, an inductor-defining conductor pattern 2li of the conductor pattern 2l preferably is longer than that of the first preferred embodiment, and the inductance of the inductor L3 of the attenuation-pole-defining sub LC parallel resonator has been increased. The shape of a capacitor-defining conductor pattern 2lc has not been changed and, hence, the capacitance of the capacitor C3 of the sub LC parallel resonator remains the same.

Figure 7:
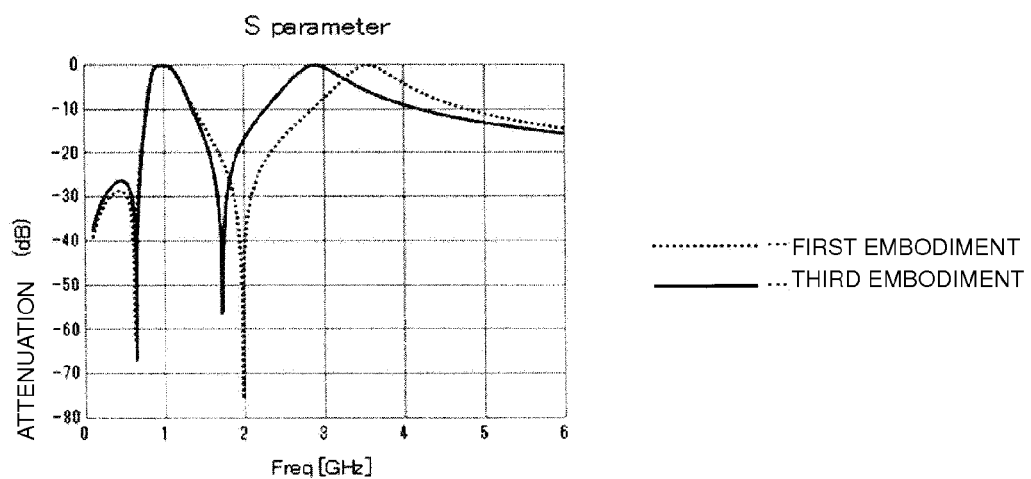
FIG. 7 is a graph illustrating the attenuation characteristics of the multilayer band pass filter according to the third preferred embodiment of the present invention.

FIG. 7 illustrates the attenuation characteristics of the multilayer band pass filter according to the third preferred embodiment. In the attenuation characteristics of the multilayer band pass filter according to the third preferred embodiment, the attenuation pole has shifted toward a lower frequency, compared with the attenuation characteristics of the multilayer band pass filter according to the first preferred embodiment illustrated in FIG. 3.

Fourth Preferred Embodiment

A multilayer band pass filter according to a fourth preferred embodiment also has a configuration in which the shape of the conductor pattern 2l provided on the dielectric layer 1h of the multilayer band pass filter according to the first preferred embodiment illustrated in FIG. 1 has been changed. The rest of the configuration of the multilayer band pass filter according to the fourth preferred embodiment preferably is the same as that of the multilayer band pass filter according to the first preferred embodiment.

Figure 8:
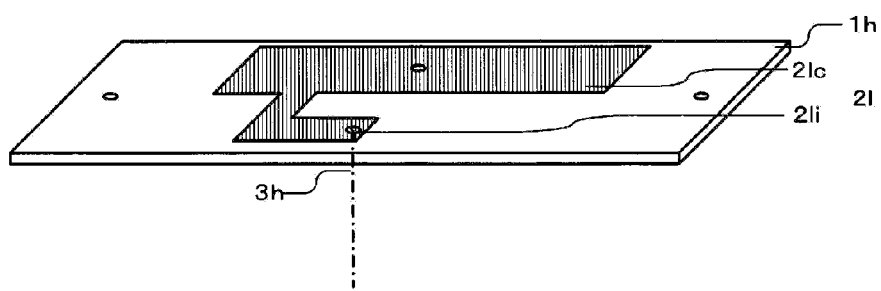
FIG. 8 is a perspective view of a dielectric layer and a conductor pattern used in a multilayer band pass filter according to a fourth preferred embodiment of the present invention.

FIG. 8 illustrates a dielectric layer 1h and a conductor pattern 2l provided on the upper main surface of the dielectric layer 1h.

In the multilayer band pass filter according to the fourth preferred embodiment, the area of a capacitor-defining conductor pattern 2lc of the conductor pattern 2l preferably is smaller than that of the first preferred embodiment, and the capacitance of the capacitor C3 of the attenuation-pole-defining sub LC parallel resonator has been reduced. The shape of an inductor-defining conductor pattern 2li has not been changed and, hence, the inductance of the inductor L3 of the sub LC parallel resonator remains the same.

Figure 9:
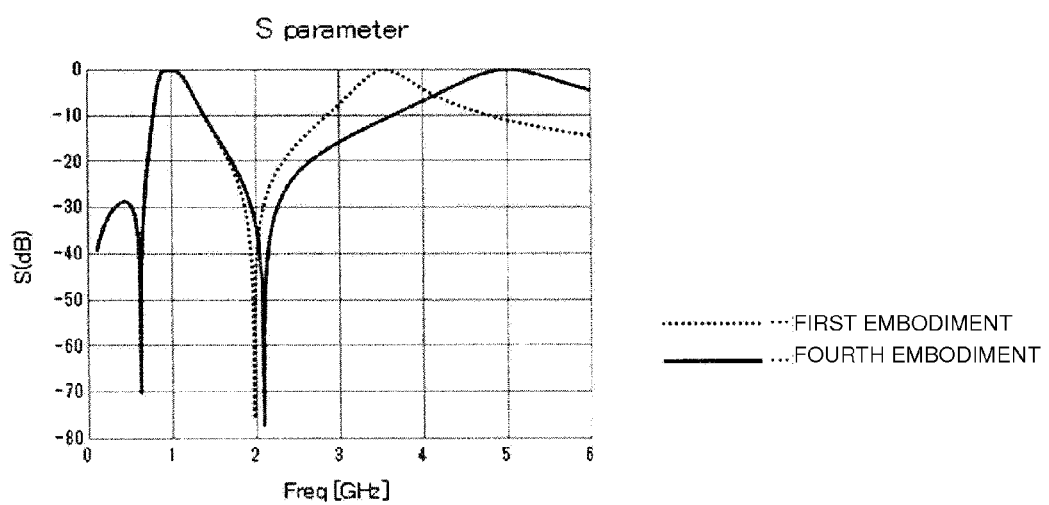
FIG. 9 is a graph illustrating the attenuation characteristics of the multilayer band pass filter according to the fourth preferred embodiment of the present invention.

FIG. 9 illustrates the attenuation characteristics of the multilayer band pass filter according to the fourth preferred embodiment. In the attenuation characteristics of the multilayer band pass filter according to the fourth preferred embodiment, the attenuation pole has shifted toward a higher frequency, compared with the attenuation characteristics of the multilayer band pass filter according to the first preferred embodiment illustrated in FIG. 3.

In the fourth preferred embodiment, with the first preferred embodiment as a reference, the capacitance of the capacitor C3 of the sub LC parallel resonator has been changed while the inductance of the inductor L3 has been kept fixed. To change the capacitance of the capacitor C3, the shape of the capacitor-defining conductor pattern 2lc of the conductor pattern 2l has been changed. However, the capacitance of the capacitor C3 can be also changed by changing the ground terminal electrode conductor pattern 2m, by changing the material of the dielectric layer 1h, or by changing the thickness of the dielectric layer 1h.

Fifth Preferred Embodiment

A multilayer band pass filter according to a fifth preferred embodiment also has a configuration in which the shape of the conductor pattern 2l provided on the dielectric layer 1h of the multilayer band pass filter according to the first preferred embodiment illustrated in FIG. 1 has been changed. The rest of the configuration of the multilayer band pass filter according to the fifth preferred embodiment preferably is the same as that of the multilayer band pass filter according to the first preferred embodiment.

Figure 10:
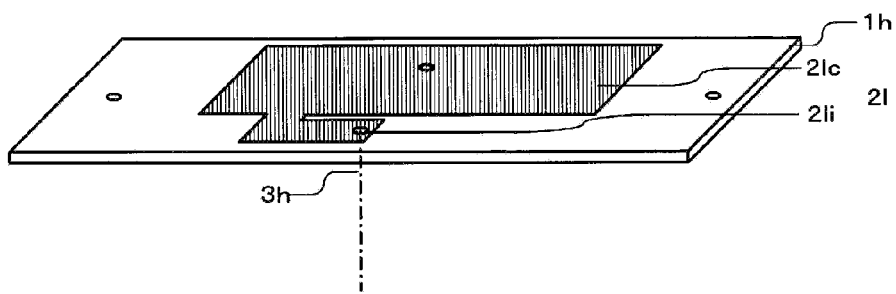
FIG. 10 is a perspective view of a dielectric layer and a conductor pattern used in a multilayer band pass filter according to a fifth preferred embodiment of the present invention.

FIG. 10 illustrates a dielectric layer 1h and a conductor pattern 2l provided on the upper main surface of the dielectric layer 1h of the multilayer band pass filter according to the fifth preferred embodiment.

In the multilayer band pass filter according to the fifth preferred embodiment, the area of a capacitor-defining conductor pattern 2lc of the conductor pattern 2l preferably is greater than that of the first preferred embodiment, and the capacitance of the capacitor C3 of the attenuation-pole-defining sub LC parallel resonator has been increased. The shape of an inductor-defining conductor pattern 2li has not been changed and, hence, the inductance of the inductor L3 of the sub LC parallel resonator remains the same.

Figure 11:
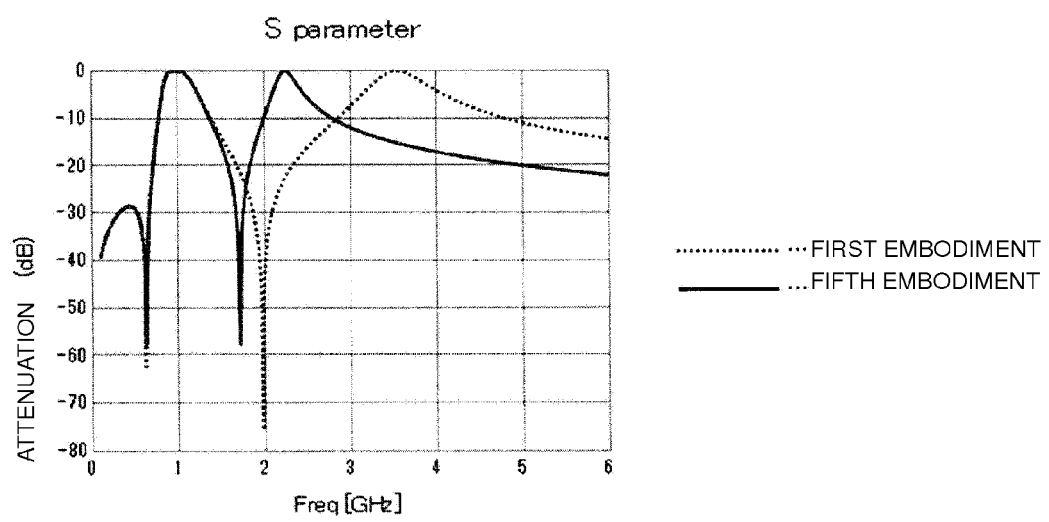
FIG. 11 a graph illustrating the attenuation characteristics of the multilayer band pass filter according to the fifth preferred embodiment of the present invention.
Figure 12:
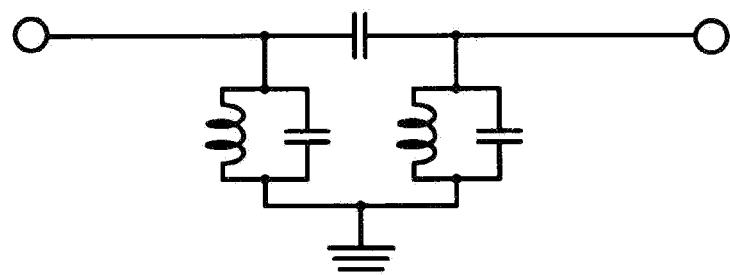
FIG. 12 illustrates an equivalent circuit of an existing multilayer band pass filter.

FIG. 11 illustrates the attenuation characteristics of the multilayer band pass filter according to the fifth preferred embodiment. In the attenuation characteristics of the multilayer band pass filter according to the fifth preferred embodiment, the attenuation pole has shifted toward a lower frequency, compared with the attenuation characteristics of the multilayer band pass filter according to the first preferred embodiment illustrated in FIG. 3.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A band pass filter circuit comprising:
    an input terminal;
    an output terminal;
    a signal line connecting the input terminal and the output terminal to each other; and
    a plurality of main LC parallel resonators each including an inductor and a capacitor; wherein
    the plurality of main LC parallel resonators are configured to be electromagnetically coupled with one another in a predetermined manner;
    the plurality of main LC parallel resonators include a first-stage main LC parallel resonator and a second-stage main LC parallel resonator;
    first ends of the first-stage main LC parallel resonator and the second-stage main LC parallel resonator of the plurality of main LC parallel resonators are connected to the signal line and second ends of the first-stage main LC parallel resonator and the second-stage main LC parallel resonator of the plurality of main LC parallel resonators are connected to one another;
    at least one sub LC parallel resonator, including an inductor and a capacitor, which defines an attenuation pole is provided between a ground and the connected second ends of the first-stage main LC parallel resonator and the second-stage main LC parallel resonator of the plurality of main LC parallel resonators; and
    the at least one sub LC parallel resonator is directly connected to both the second end of the first-stage main LC parallel resonator and the second end of the second-stage main LC parallel resonator.

2. The band pass filter circuit according to claim 1, wherein the at least one sub LC parallel resonator has a higher resonant frequency than the plurality of main LC parallel resonators.

3. The band pass filter circuit according to claim 1, further comprising a coupling capacitor between the input terminal and the output terminal.

4. The band pass filter circuit according to claim 3, wherein the signal line includes a path that connects the input terminal, the coupling capacitor, and the output terminal to one another.

5. The band pass filter circuit according to claim 1, wherein the capacitor and the inductor of the first-stage main LC parallel resonator are connected in parallel with each other and capacitor and the inductor of the second-stage main LC parallel resonator are connected in parallel with each other.

6. A multilayer band pass filter comprising:
the band pass filter circuit according to claim 1;
an input terminal electrode;
an output terminal electrode;
a plurality of dielectric layers;
a plurality of capacitor-defining conductor patterns;
a plurality of inductor-defining conductor patterns;
at least one grounding conductor pattern; and
a plurality of via conductors; wherein
each capacitor of the plurality of main LC parallel resonators includes at least one of the plurality of dielectric layers and at least one pair of the capacitor-defining conductor patterns with the at least one dielectric layer therebetween, and each inductor of the plurality of main LC parallel resonators includes at least one of the inductor-defining conductor patterns and at least one of the conductor vias; and
the capacitor of the at least one sub LC parallel resonator includes one or a plurality of dielectric layers neighboring each other among the plurality of dielectric layers, and the grounding conductor pattern and at least one of the capacitor-defining conductor patterns with the one or plurality of dielectric layers therebetween, and the inductor of the at least one sub LC parallel resonator includes one of the inductor-defining conductor patterns arranged on a main surface of one of the plurality of dielectric layers and extending from the capacitor-defining conductor pattern of the capacitor of the at least one sub LC parallel resonator and one of the conductor vias provided in the one or plurality of dielectric layers.

7. The multilayer band pass filter according to claim 6, wherein among the capacitor-defining conductor pattern and the grounding conductor pattern defining the capacitor which defines a portion of the sub LC parallel resonator, the capacitor-defining conductor pattern is arranged closer to the plurality of main LC parallel resonators than the grounding conductor.

8. The multilayer band pass filter according to claim 6, further comprising a coupling capacitor between the input terminal and the output terminal.

9. The band pass filter circuit according to claim 6, wherein the signal line includes a path that connects the input terminal, the coupling capacitor, and the output terminal to one another.

10. The multilayer band pass filter according to claim 6, wherein the capacitor and the inductor of the first-stage main LC parallel resonator are connected in parallel with each other and capacitor and the inductor of the second-stage main LC parallel resonator are connected in parallel with each other.

11. The multilayer band pass filter according to claim 6, wherein at least one of the inductor-defining conductor patterns has a shape that is one of straight, substantially straight, curved, substantially curved, rectangular, substantially rectangular, meandering, substantially meandering, saw pattern, and substantially saw pattern.

* * * * *